United States Patent
Wittmann et al.

(10) Patent No.: US 7,535,017 B2
(45) Date of Patent: May 19, 2009

(54) FLEXIBLE MULTILAYER PACKAGING MATERIAL AND ELECTRONIC DEVICES WITH THE PACKAGING MATERIAL

(75) Inventors: Georg Wittmann, Herzogenaurach (DE); Debora Henseler, Erlangen (DE); Karsten Heuser, Erlangen (DE); Ralph Paetzold, Roth (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/816,718

(22) Filed: Apr. 2, 2004

(65) Prior Publication Data

US 2004/0239241 A1    Dec. 2, 2004

Related U.S. Application Data

(60) Provisional application No. 60/474,427, filed on May 30, 2003.

(51) Int. Cl.
    *H01L 51/30* (2006.01)
(52) U.S. Cl. ........................................ 257/40
(58) Field of Classification Search ............ 257/40–43, 257/35, 13, 79, 642, 753, 759, 918, E21.444; 438/22, 82, 99, 128; 428/458
    See application file for complete search history.

(56) References Cited

U.S. PATENT DOCUMENTS

| | | | | |
|---|---|---|---|---|
| 4,576,995 A | * | 3/1986 | Nakabayashi et al. | 525/285 |
| 4,637,197 A | | 1/1987 | Banfield | |
| 5,312,689 A | * | 5/1994 | Dasher et al. | 428/413 |
| 5,587,233 A | * | 12/1996 | Konig et al. | 428/325 |
| 5,707,745 A | * | 1/1998 | Forrest et al. | 428/432 |
| 6,333,103 B1 | * | 12/2001 | Ishii et al. | 428/325 |
| 6,368,730 B1 | | 4/2002 | Kishimoto et al. | |
| 6,497,598 B2 | | 12/2002 | Affinito | |
| 6,522,067 B1 | | 2/2003 | Graff et al. | |
| 6,548,912 B1 | * | 4/2003 | Graff et al. | 257/787 |
| 6,614,057 B2 | | 9/2003 | Silvernail et al. | |
| 6,624,568 B2 | * | 9/2003 | Silvernail | 313/504 |

(Continued)

FOREIGN PATENT DOCUMENTS

DE    19943149 A1    4/2004

(Continued)

OTHER PUBLICATIONS

Solis, James A. et al., "Factors Affecting the Performance of New Oxygen-Scavenging Polymer for Packaging Applications", Presented at *Polyolefins 2001*, Feb. 2001, http://www.cpchem.com/cps/rde/xbcr/SID-A05EF14-D6371651/cpchem/factorsslides.pdf, 24 pp.

(Continued)

*Primary Examiner*—Nathan W Ha
(74) *Attorney, Agent, or Firm*—Fish & Richardson P.C.

(57) ABSTRACT

The invention discloses a flexible multilayer packaging material for protecting articles that are sensitive to moisture and oxidizing agents. The packaging material has at least one active polymeric barrier layer that is able to bind the moisture and oxidizing agents and at least one ceramic barrier layer. The combination of the active polymeric barrier layer and the ceramic barrier layer significantly enhances the barrier abilities of the multilayer packaging material.

20 Claims, 3 Drawing Sheets

U.S. PATENT DOCUMENTS

| | | | |
|---|---|---|---|
| 6,689,438 B2 * | 2/2004 | Kennedy et al. | 428/36.6 |
| 6,692,986 B1 | 2/2004 | Bayer et al. | |
| 6,710,542 B2 * | 3/2004 | Chun et al. | 313/506 |
| 6,841,497 B1 * | 1/2005 | Krell et al. | 501/153 |
| 6,867,254 B2 * | 3/2005 | Wiercinski et al. | 524/556 |
| 6,867,539 B1 * | 3/2005 | McCormick et al. | 313/504 |
| 6,891,330 B2 * | 5/2005 | Duggal et al. | 313/511 |
| 6,897,474 B2 * | 5/2005 | Brown et al. | 257/40 |
| 7,074,501 B2 * | 7/2006 | Czeremuszkin et al. | 428/690 |
| 7,204,940 B2 * | 4/2007 | McDonald et al. | 252/512 |
| 2002/0113548 A1 | 8/2002 | Silvernail | |
| 2003/0113525 A1 * | 6/2003 | Beaverson et al. | 428/297.4 |
| 2003/0134460 A1 * | 7/2003 | Forbes et al. | 438/158 |
| 2003/0189403 A1 * | 10/2003 | Yamada et al. | 313/511 |
| 2003/0203210 A1 | 10/2003 | Graff et al. | |
| 2004/0131809 A1 | 7/2004 | McKnight | |
| 2004/0195967 A1 * | 10/2004 | Padiyath et al. | 313/512 |
| 2005/0186443 A1 * | 8/2005 | Marrocco et al. | 428/690 |

FOREIGN PATENT DOCUMENTS

| | | |
|---|---|---|
| EP | 1 164 644 A | 12/2001 |
| EP | 1094940 B1 | 11/2002 |
| EP | 03005270.8 | 3/2003 |
| EP | 1161485 B1 | 4/2003 |
| JP | 2002-347853 A | 12/2002 |
| JP | 2003-100448 | 8/2003 |
| WO | 97/47467 * | 12/1997 |
| WO | WO 00/48749 | 8/2000 |
| WO | WO 01/81649 A1 | 11/2001 |

OTHER PUBLICATIONS

Ticona, Markets/Applications, Packaging Over View, "Ticona's Product Portfolio Finds Uses in a Variety of Packaging Structures", © 2000 Ticona, http://www.ticona-us.com/Mkt_Apps/PackOver.cfm, pp. 1-2.

Bentley, David Jr., "PFFC Paper Film & Foil Converter®, Division Conference Offers Varied Program", Jun. 1, 2001, http://pffc-online.com/magazinearticle.asp?magazinearticleid=105277&magazineid=4'..., pp. 1-7.

Bentley, David Jr., "PFFC Paper Film & Foil Converter®," Polymers/Laminations/Adhesives/Coatings/Extrusions, Nov. 1, 2001, http://pffc-online.com/magazinearticle.asp?magazinearticleid=13363&magazineid=4'..., pp. 1-6.

Leventon, W., "Adapting Packaging Technology to Meet Device Industry Needs", Jan. 2001, http://www.devicelink.com/mddi/archive/01/01/002.html, pp. 1-7.

* cited by examiner

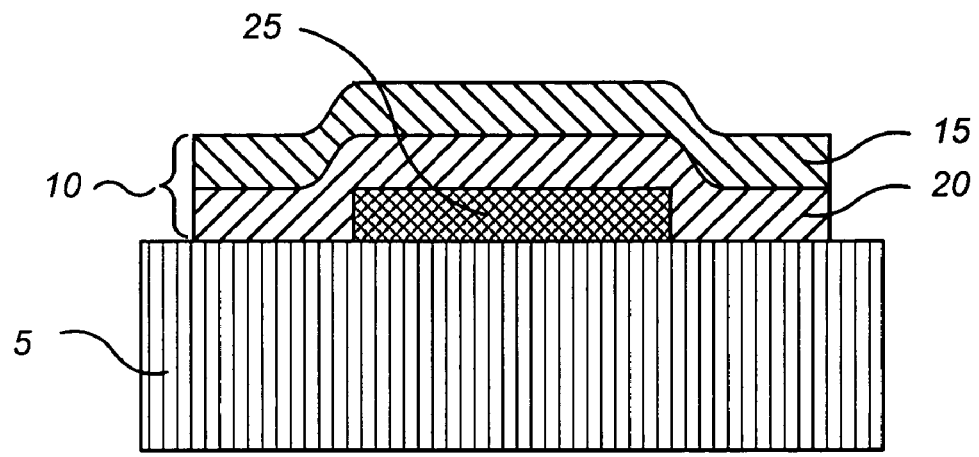
PRIOR ART
FIG._1
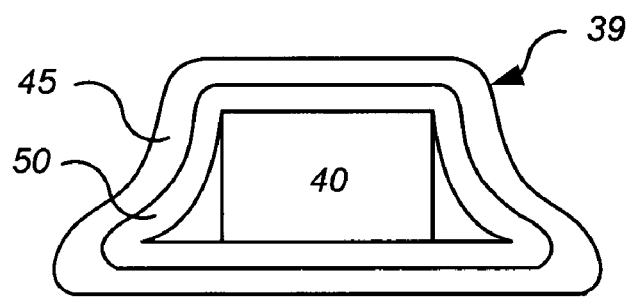
FIG._2

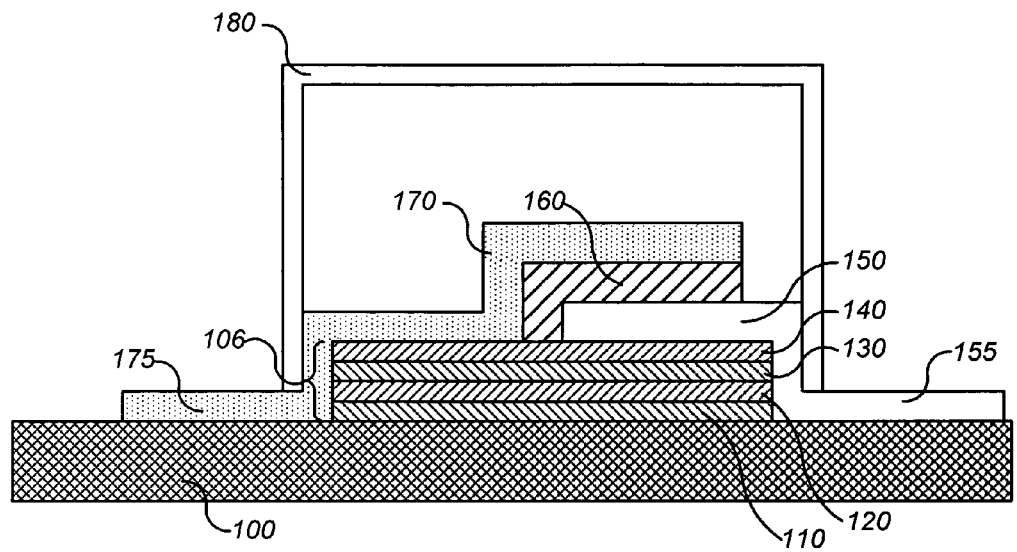
FIG._3
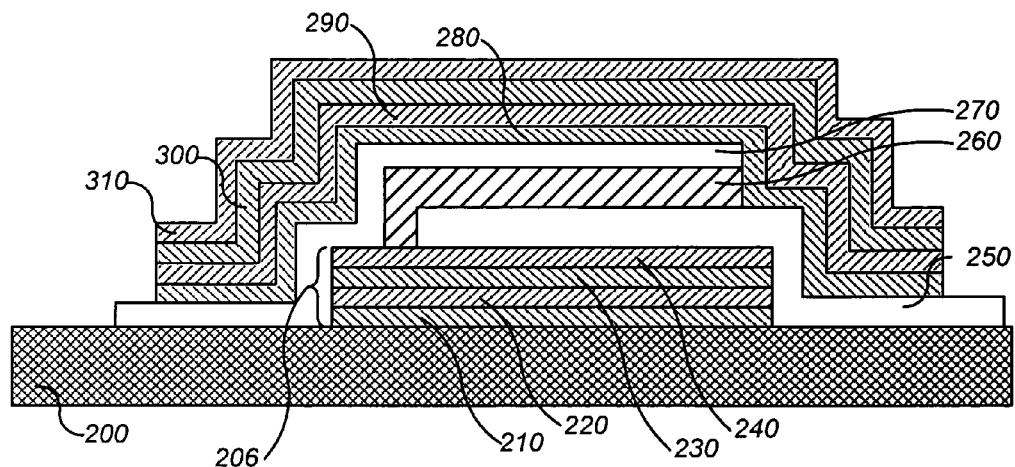
FIG._4

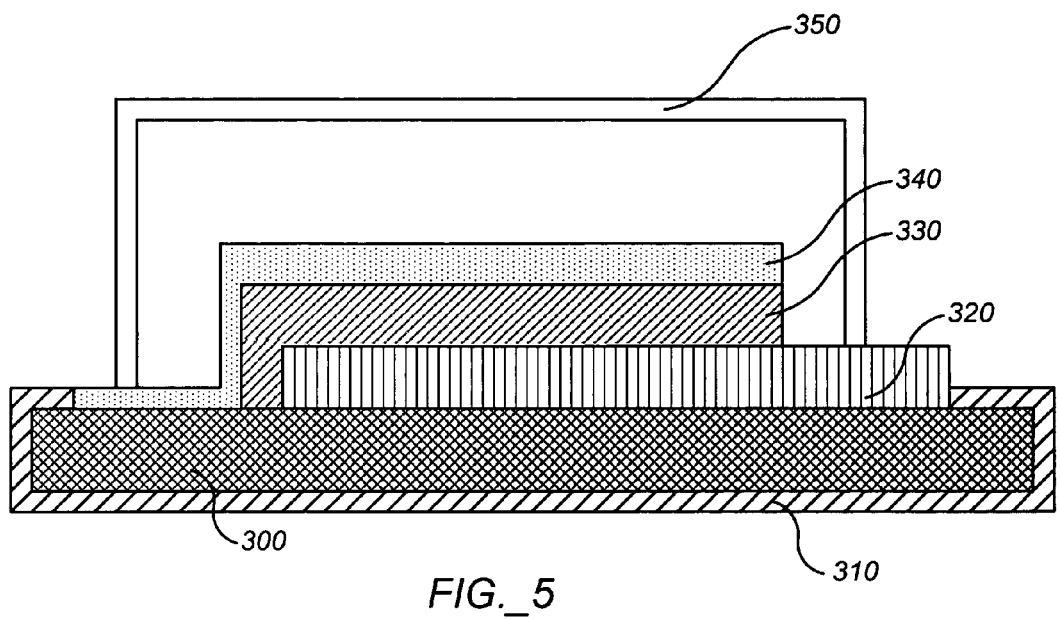
FIG._5

FLEXIBLE MULTILAYER PACKAGING MATERIAL AND ELECTRONIC DEVICES WITH THE PACKAGING MATERIAL

This application claims the benefit of U.S. Provisional Application No. 60/474,427, filed on May 30, 2003, which is incorporated by reference herein.

BACKGROUND

Many articles, for example food, electronic devices or pharmaceuticals, are very sensitive to moisture and/or oxidizing agents. Many of these products rapidly degrade upon exposure to water, oxidizing agents or other gases or liquids. Polymeric substrates, such as polymeric foils, are often used to package these products. These foils frequently exhibit a permeability for water vapor and for oxidizing agents in the range of more than 1 $g/(m^2 day)$. This high degree of permeability is unacceptable for most of the products packaged by polymeric foils.

One packaging application that uses polymeric substances is the packaging of organic electroluminescent devices (OLEDs). An OLED device includes a functional stack formed on a substrate. The functional stack has at least one organic functional layer sandwiched between two conductive layers. The conductive layers serve as electrodes (cathode and anode). When a voltage is applied to the electrodes, charge carriers are injected through these electrodes into the functional layer and upon recombination of the charge carriers visible radiation can be emitted (electroluminescence). This functional stack of the OLED tends to be very sensitive to moisture and oxidizing agents, which can cause, for example, oxidation of the metals of the electrodes or deterioration of the organic functional layers.

Due to the intrinsic properties of the organic functional layers, flexible OLED devices can be built up on flexible substrates, for example, polymeric substrates. For sufficient life-time of the OLEDs, polymeric substrates with a permeability for water or oxidizing agents below $10^{-6}$ $g/(m^2 day)$ are desireable.

FIG. 1 depicts a conventional environmentally sensitive display device encapsulated by a barrier assembly having a ceramic barrier layer and a polymeric layer. A device 25 is arranged on a substrate 5. The device 25 is encapsulated by a barrier stack having a ceramic barrier layer 20 and a passive polymeric layer 15. Due to the high permeability of the polymeric layer 15 most of the barrier abilities of the barrier stack are attributed to the ceramic barrier layer 20.

Tightly controlled conditions for the deposition of this ceramic barrier layer are typically necessary for the ceramic barrier layer to have a low incidence of defects, such as pinholes, grain boundaries and shadowing effects. These defects can provide a continuous path for permeants to pass through the ceramic layer and the defects can therefore lead to a decreased ability of the ceramic barrier layer to function as a barrier. Often several thin ceramic layers are deposited on top of each other in order to enhance the barrier abilities of the ceramic barrier layers. This can lead to a complicated and therefore expensive production of flexible barrier layers.

SUMMARY

There is a need for polymeric substrates with improved barrier abilities. The present invention can meet these needs by providing a flexible multilayer packaging material.

In on aspect, the invention is directed to a flexible multilayer packaging material for protecting articles that are sensitive to moisture and oxidizing agents. The packaging material includes at least one active polymeric barrier layer that is able to bind the moisture and oxidizing agents and at least one ceramic barrier layer.

In contrast to conventional multilayer packaging materials, the invention can provide a polymeric barrier layer that can actively bind and therefore neutralize permeants. This binding can take place by chemi- or physisorption of the permeants. The active polymeric barrier layer can exhibit an enhanced barrier ability in comparison to the conventional passive polymeric layers that are typically not able to bind permeants.

The invention will be explained in more detail by the figures.

DESCRIPTION OF THE DRAWINGS

FIG. 1 shows a conventional electronic device.

FIG. 2 shows a containment encapsulating an article.

FIG. 3 shows one embodiment of an organic electroluminescent device having an assembly of ceramic barrier layers and active polymeric barrier layers.

FIG. 4 shows an embodiment of an organic electroluminescent device having a barrier assembly with ceramic barrier layers and active polymeric barrier layers encapsulating an organic functional stack.

FIG. 5 shows yet another embodiment of an organic electroluminescent device having a substrate with an active polymeric barrier layer.

DETAILED DESCRIPTION

A flexible multilayer packaging material for protecting articles that are sensitive to moisture and oxidizing agents can include at least one active polymeric barrier layer that can bind the moisture and oxidizing agents and at least one ceramic barrier layer.

The multilayer packaging material of the invention can seal an article, e.g., food, pharmaceuticals or sensitive electronic devices from the environment. The active polymeric layer can bind the moisture and oxidizing agents chemically. Due to the enhanced barrier abilities of the active polymeric barrier layers in comparison to passive polymeric layers, the required barrier capabilities of the ceramic barrier layers can be reduced, for example, by one order of magnitude from $5*10^{-5}$ $g/(m^2 day)$ to $5*10^{-4}$ $g/(m^2 day)$. Moreover, the deposition conditions for the ceramic barrier layers may not need to be as tightly controlled as with ceramic barrier layers of higher barrier abilities. Therefore the reduced requirements of the ceramic barrier layer result in a simplified production of a multilayer packaging material of the invention.

The active polymeric barrier layer can be selected from a polymeric matrix with dispersed cyclodextrines, cyclic olefin copolymers, a polymeric matrix with anhydrides and mixtures thereof.

Cyclodextrines are cyclic oligomers of α-D-glucose formed by the action of certain enzymes such as cyclodextrin glucotransferases. The cyclodextrines can consist of six, seven or eight α-1,4-linked glucose monomers and are known as α-, β- or γ-cyclodextrines. The cyclodextrine molecules can beorientated in a special manner relative to each other so that continuous channels can be formed within the crystal lattice of the cyclodextrines. These channels can have large hollow interiors of a specific volume and are therefore able to bind permeants, e.g., gas molecules. The permeants can be linked covalently to the cyclodextrine molecules, for example, by the primary hydroxyl groups at the six-carbon positions of the glucose moiety and the secondary hydroxyl group in the two- and three-carbon positions of the molecule. These hydroxyl groups can also be replaced by other groups in order to change the solubility, compatibility and the thermostability of the cyclodextrines. The substitution of the hydroxyl groups can also be used to adjust the binding strength to a value lying between the binding strength of cyclodextrines and of potential permeants. Therefore the cyclodextrines should be able to permanently neutralize, for example, moisture or oxidizing agents. Cyclodextrines can be dispersed in a polymeric matrix like polypropylene.

The cyclic olefin copolymers can, for example, comprise two components which are blended by extrusion. One component can, for example, be an oxidizable polymer, such as poly(ethylene/methylacrylate/cyclohexenyl-methylacrylate) (EMCM). Another component can consist of a photoinitiator and a catalyst, for example a transition metal catalyst. Both components can form a oxygen scavenging system that can be activated, for example upon exposure to UV-radiation. The cyclic olefin groups of these polymers are then able to chemically react, e.g., with oxygen molecules via ring opening reactions or aromatization reactions.

In another embodiment, the active polymeric barrier layer can be a polymeric matrix with anhydrides. The anhydrides can be carbonic acid anhydrides which can be formed by removing water from the respective free acids. Therefore, these anhydrides are able to bind moisture, e.g. water molecules. Examples of acid anhydrides includes acid anhydrides of organic acids, such as maleic anhydride. The acid anhydrides can be bound covalently to the polymeric matrix, e.g., polystyrene. It is also possible to use a mixture of cyclodextrines, cyclic olefin copolymers and anhydrides to ensure an optimal barrier performance for different types of oxidizing agents or moisture.

It is also possible to use liquid crystal polymers as an active polymeric barrier layer. These polymers exhibit the same properties as liquid crystals and are often synthesized by the polycondensation of aromatic dicarboxylic acids and aromatic diamines or phenols.

In one embodiment, the ceramic barrier layer is selected from metal nitrides, metal oxides and metal oxynitrides. The metal components of these metal nitrides, metal oxides or metal oxynitrides can be aluminum. These ceramic barrier layers provide a physical barrier for the permeation of gases or liquids. Other ceramic materials that predominantly comprise inorganic and non-metallic compounds or elements can be used, such as silicon nitride, silicon oxide and silicon oxynitride.

In one embodiment, at least one active polymeric barrier layer and at least one ceramic barrier layer are transparent. Transparent, flexible, multilayer packaging materials can be the materials for organo-optical devices like the above-mentioned OLEDs, because these materials are transparent for the light emitted by the OLEDs.

In one embodiment, a containment for the protection of articles can include a multilayer flexible packaging material. This containment can have an assembly of alternating polymeric barrier layers and ceramic barrier layers. An assembly of alternating ceramic barrier layers and polymeric barrier layers can exhibit very high barrier abilities and exhibit permeation rates of less than $10^{-6}$ g/(m$^2$day) for several thousand hours.

One of the ceramic barrier layers of the assembly can face towards the outside of the containment. This ceramic barrier layer can prevent most of the moisture and oxidizing agents from permeating into the interior of the containment. The few molecules which are able to permeate through this outside ceramic barrier layer can then be absorbed by the active polymeric barrier layer, which can face the interior of the containment and is arranged on the ceramic barrier layer. It can take approximately 10,000 hours before the first permeating molecule can reach an article packed in a containment having a 1 μm thick active polymeric barrier layer that is arranged on a ceramic barrier layer with a diffusion rate of $10^{-3}$ g/(m$^2$day).

It is also possible to change the sequence of the different ceramic barrier layers and active polymeric barrier layers. For example, it is possible to arrange a first and a second barrier layer on top of each other, the first ceramic barrier layer facing towards the outside of the containment. Moving toward the interior of the containment, these two ceramic barrier layers might be followed by an active polymeric barrier layer that is able to absorb the residual molecules permeating through the two ceramic barrier layers.

The barrier abilities of the two ceramic barrier layers can be enhanced by decoupling the defects of the first and second ceramic barrier layers. Decoupling can be achieved, for example, by changing the deposition parameters and growth conditions during the deposition of the two ceramic barrier layers. For example, it is possible to deposit two aluminum oxide ceramic barrier layers on top of each other, where the first layer is different from the second layer, for example by depositing a layer of α-aluminum oxide and a layer of γ-aluminum-oxide. This should lead to adjacent ceramic barrier layers that exhibit different microstructures and therefore diminish the path for gases and water vapor permeation, leading to enhanced barrier abilities. It is also possible to deposit a first ceramic barrier layer on the active polymeric barrier layer, modify the surface of the first ceramic barrier layer to introduce new nucleation sites on the surface of this first ceramic barrier layer and subsequently form a second ceramic barrier layer on the first ceramic barrier layer using the new nucleation sites. This method can also lead to mismatched adjacent ceramic barrier layers leading to enhanced barrier abilities of an assembly of two ceramic barrier layers. Methods for forming an arrangement of two subsequent barrier layers on polymeric substrates are described in detail in the copending European patent application, application No. 03 005 270.8, "Method for Forming an Arrangement of Barrier Layers on a Polymeric Substrate", which is hereby incorporated by reference in its entirety.

In one embodiment, the surface of the containment facing towards the outside of the containment consists entirely of a ceramic barrier layer.

Yet a further embodiment includes an organic electronic device that is sensitive to moisture or oxidizing agents and comprises a flexible substrate, an organic functional area on the substrate, a cap encapsulating the organic functional area and a flexible multilayer packaging material having a ceramic barrier layer and an active polymeric barrier layer for protecting the organic functional area. Such an organic electronic device exhibits a prolonged shelf life due to the enhanced barrier abilities that are attributed mainly to the flexible multilayer packaging material and the cap.

It is possible to arrange the flexible multilayer packaging material that has an assembly of the ceramic barrier layer and the active polymeric barrier between the substrate and the organic functional area. It is also possible to integrate the flexible multilayer packaging of the invention directly into the substrate. Polymeric substrates like poly-ethylenetherepthalate (PET) or polyethersulfones (PES) can be used to form flexible organic electronic devices. Normally the polymeric substrates of these flexible organic electric devices are much thicker than the ceramic barrier layers (thickness of ceramic barrier layers between 1 and 250 nm) or the active polymeric barrier layers (which are around 1 to 10 μm). Flexible polymeric substrates normally have a thickness of around 100 to 200 μm. The polymeric substrate can be formed by co-extruding the materials that scavenge moisture and oxidizing agents, such as cyclodextrines, cyclic olefin copolymers or anhydrides, so that the polymeric substrate itself can serve as an active polymeric barrier layer. Such a substrate can exhibit very high barrier abilities due to its thickness.

A cap encapsulating the organic functional stack can be a polymer, metal, glass or a combination thereof It is also possible that the cap has a flexible multilayer packaging material consisting of ceramic barrier layers and active polymeric barrier layers.

In one embodiment, the substrate has an assembly of alternating active polymeric barrier layers and ceramic barrier layers. This assembly can result in very good barrier characteristics and therefore can lead to a prolonged shelf life of the organic electric device. The surface of the substrate facing towards the outside environment can have a ceramic barrier layer, which physically blocks the gases and liquid molecules from permeating into the device.

The organic functional area can have a stack of a first electrically conductive layer, an organic functional layer on the first conductive layer and a second electrically conductive layer on the functional layer, wherein the organic functional layer comprises at least one organic, electroluminescent layer. An electronic device with such an organic functional stack forms an organic electroluminescent device (OLED).

The organic functional layer between the first electrically conductive and the second electrically conductive layer can also be an organic radiation-detecting layer, so that the electronic device provides an organic radiation-detecting device, for example, an organic solar cell. The organic functional area can also form an integrated plastic circuit having organic electrically conductive materials.

FIG. 2 is a cross-sectional view of a containment 39 that encapsulates an environmentally sensitive article 40. The containment 39 can consist of a ceramic barrier layer 45 and an active polymeric barrier layer 50. The active polymeric barrier layer 50 is able to absorb the residual oxygen and moisture permeating through the ceramic barrier layer 45, resulting in a containment with enhanced barrier capabilities. For higher barrier capabilities, more ceramic barrier layers and active polymeric barrier layers can be arranged on this containment, leading to arrangements of alternating ceramic barrier layers and active polymeric barrier layers.

FIG. 3 depicts a cross-sectional view of one embodiment of an organic electronic device having ceramic barrier layers and active polymer barrier layers. An organic functional stack is arranged on a substrate 100. An assembly 106 of different ceramic barrier layers and active polymeric barrier layers is arranged between the substrate 100 and the organic functional stack to function as a flexible multilayer packaging material. The assembly 106 has an ceramic barrier layer 110 facing the substrate 100, an active polymeric barrier layer 120 and again a ceramic barrier layer 130 and an active polymeric barrier layer 140. The active polymeric barrier layer 120 is able to bind the residual moisture and oxygen permeating through the ceramic barrier layer 110. On top of the active polymeric barrier layer 120 a ceramic barrier layer 130 is arranged. This ceramic barrier layer 130 serves to block gases and moisture permeating through the active polymeric barrier layers 120. To complete the barrier assembly 106 the additional active polymeric barrier layer is arranged on the ceramic barrier layers that can bind molecules permeating through the two ceramic barrier layers 110 and 130.

The organic functional stack has at least one organic functional layer 160 sandwiched between a first electrically conductive layer 150 and a second electrically conductive layer 170. In the case of organic electroluminescent devices, at least one organic functional layer 160 includes at least one organic electroluminescent layer. The environmentally sensitive organic functional stack is encapsulated by a cap 180 that can comprise polymers, metals and glass. Contacts 155 and 175 are present, which contact the first 150 and second 170 electrically conductive layers and can provide contact pads. Due to the enhanced barrier abilities of the substrate 100 which are mainly conferred by the barrier assembly 106, such an organic electronic device can exhibit a prolonged shelf life.

FIG. 4 shows a cross-sectional view of yet another embodiment of an organic electronic device. A barrier assembly 206 is arranged between an organic functional stack and a substrate 200. In contrast to the device in FIG. 3, the barrier assembly 206 consists of an assembly of a ceramic barrier layer 210 followed by an active polymeric barrier layer 220 on which another ceramic barrier layer 230 and a second active polymeric barrier layer 240 are deposited. The organic functional stack has at least one organic functional layer 260 sandwiched between a first electrically conductive layer 250 and a second electrically conductive layer 270. Instead of a cap, as shown in FIG. 3, a barrier assembly of alternating ceramic barrier layers and active polymeric barrier layers is arranged on top of the functional stack and encapsulates the organic functional stack. The barrier assembly consists of a sequence of an active polymeric barrier layer 280, a ceramic barrier layer 290, an active polymeric barrier layer 300 and a ceramic barrier layer 310. In the case of an organic electroluminescent display or an organic radiation detecting device, the substrate 200 and the ceramic barrier layers and polymeric barrier layers can be transparent in order to enable the light to pass through the different layers.

FIG. 5 depicts an organic electronic device, where the substrate 300 itself provides an active polymeric barrier layer. On the substrate 300 a ceramic barrier layer 310 is arranged, completely covering the substrate 300 in order to prevent moisture and oxidizing agents from permeating into the substrate and the organic functional stack. The organic functional stack has at least one organic functional layer 330 sandwiched between a first electrically conductive layer 320 and a second electrically conductive layer 340. The functional stack is encapsulated by a cap 350.

The scope of the invention is not limited to the embodiments shown in the figures. Variations, especially concerning the sequence of the ceramic barrier layers and the active polymeric barrier layers in barrier assemblies, are possible. The invention is embodied in each novel characteristic and each combination of characteristics, which includes every combination of any features which are stated in the claims, even if this combination of features is not explicitly stated in the claims.

What is claimed is:

1. An organic electronic device that has one or more components that are sensitive to moisture or oxidizing agents, comprising:
   a flexible substrate;
   a functional area on the substrate, comprising one or more active organic elements;
   a cap encapsulating the functional area; and
   a first flexible multilayer packaging material having a first active polymeric barrier layer that binds moisture and oxidizing agents and a ceramic barrier layer; wherein the first flexible multilayer packaging material protects the functional area; and the first active polymeric barrier layer includes a material comprising a polymeric matrix with anhydrides.

2. The organic electronic device according to claim 1, wherein:

the first flexible multilayer packaging material is arranged between the functional area and the flexible substrate.

3. The organic electronic device according to claim 1, wherein the cap comprises the first flexible multilayer packaging material.

4. The organic electronic device according to claim 1, wherein the cap comprises a second flexible multilayer packaging material comprising:

at least one ceramic barrier layer; and at least one active polymeric barrier layer that binds the moisture and oxidizing agents;

wherein the at least one active polymeric barrier layer of the second flexible multilayer packaging material includes one or more materials from the group consisting of a polymeric matrix with dispersed cyclodextrines, a cyclic olefin copolymer and a polymeric matrix with anhydrides.

5. The organic electronic device according to claim 1, wherein:

the cap includes one or more materials from the group consisting of polymers, metals and glass.

6. The organic electronic device according to claim 1, wherein:

the flexible substrate comprises a polymer.

7. The organic electronic device according to claim 6, wherein:

the cap comprises a second flexible multilayer packaging material comprising:

at least one active polymeric barrier layer that binds the moisture and oxidizing agents; and at least one ceramic barrier layer.

8. The organic electronic device according to claim 6, wherein:

the cap comprises a second flexible multilayer packaging material comprising:

at least one active polymeric barrier layer in the second flexible multilayer packaging material that binds the moisture and oxidizing agents; and at least one ceramic barrier layer;

wherein the at least one active polymeric barrier layer includes one or more materials from the group consisting of a polymeric matrix with dispersed cyclodextrines, a cyclic olefin copolymer and a polymeric matrix with anhydrides.

9. The organic electronic device according to claim 6, wherein:

the flexible substrate includes a second active polymeric barrier layer.

10. The organic electronic device according to claim 1, wherein:

the flexible substrate comprises an assembly of active polymeric barrier layers and ceramic barrier layers.

11. The organic electronic device according to claim 10, wherein:

the substrate has a first surface and a second surface, the first surface is closer to the functional area than the second surface and the second surface comprises a ceramic barrier layer.

12. The organic electronic device according to claim 1, wherein:

the one or more active organic elements comprise at least one stack having a first electrically conductive layer, an organic functional layer on the first conductive layer and a second electrically conductive layer on the organic functional layer; and the organic functional layer comprises at least one organic electroluminescent layer.

13. The organic electronic device according to claim 1, wherein:

the one or more active organic elements include at least one stack comprising a first electrically conductive layer, an organic functional layer on the first conductive layer and a second electrically conductive layer on the organic functional layer; and the functional layer comprises at least one organic radiation detecting layer forming an organic radiation sensor.

14. The organic electronic device according to claim 1, wherein the anhydrides are acid anhydrides of organic acids.

15. The organic electronic device according to claim 1, wherein the first active polymeric barrier layer comprises polystyrene.

16. An organic electronic device having one or more components that are sensitive to moisture or oxidizing agents, comprising:

a flexible substrate;

an organic functional area on the substrate, comprising one or more active organic elements;

a cap encapsulating the organic functional area; and a first flexible multilayer packaging material having a first active polymeric barrier layer that binds moisture and oxidizing agents via chemi- or physisorption and a ceramic barrier layer; wherein the first flexible multilayer packaging material protects the organic functional area; and the substrate comprises an assembly of at least one active polymeric barrier layer and at least one ceramic barrier layer, the substrate having a first surface and a second surface, the first surface being closer to the functional area than the second surface and the second surface comprising a ceramic barrier.

17. The organic electronic device according to claim 16, wherein the first active polymeric barrier layer chemically binds moisture and oxidizing agents.

18. An organic electronic device having one or more components that are sensitive to moisture or oxidizing agents, comprising:

a flexible substrate;

an organic functional area on the substrate, comprising one or more active organic elements;

a cap encapsulating the organic functional area; and a first flexible multilayer packaging material that binds moisture and oxidizing agents via chemi- or physisorption and a ceramic barrier layer; wherein the first flexible multilayer packaging material protects the organic functional area; and the substrate comprises an assembly of at least one active polymeric barrier layer adjacent to first and second ceramic barrier layers, the first and second ceramic barrier layers being directly adjacent to one another and exhibiting different microstructures.

19. The device of claim 18, wherein the first and second ceramic barrier layers comprise $\alpha$-$Al_2O_3$ and $\gamma$-$Al_2O_3$, respectively.

20. An organic electronic device having one or more components that are sensitive to moisture or oxidizing agents, comprising:

a flexible substrate;

an organic functional area on the substrate, comprising one or more active organic elements;

a cap encapsulating the organic functional area; and a first flexible multilayer packaging material that binds moisture and oxidizing agents via chemi- or physisorption and a ceramic barrier layer; wherein the first flexible multilayer packaging material protects the organic functional area; and the substrate comprises an assembly of at least one active polymeric barrier layer adjacent to first and second ceramic barrier layers, the first and second ceramic barrier layers being directly adjacent to one another, and the first and second ceramic barrier layers having the same composition but exhibiting different microstructures from one another.

* * * * *